United States Patent [19]

McCollum

[11] 4,048,605

[45] Sept. 13, 1977

[54] SPLIT CORE CURRENT TRANSFORMER HAVING AN INTERLEAVED JOINT AND HINGE STRUCTURE

[75] Inventor: Samuel C. McCollum, Springfield, Ill.

[73] Assignee: Sangamo Electric Company, Springfield, Ill.

[21] Appl. No.: 674,035

[22] Filed: Apr. 5, 1976

[51] Int. Cl.² .................... H01F 17/06; H01F 27/24
[52] U.S. Cl. ..................................... 336/176; 336/217
[58] Field of Search ............... 336/176, 210, 212, 216, 336/217, 175; 324/127

[56] References Cited

U.S. PATENT DOCUMENTS

| 750,525 | 1/1904 | Everest | 336/176 |
|---|---|---|---|
| 1,569,723 | 1/1926 | Dickinson | 336/176 X |
| 1,830,541 | 11/1931 | Harris | 336/176 |
| 2,476,121 | 7/1949 | Smith, Jr. | 336/176 X |
| 3,253,215 | 5/1966 | Moakler et al. | 324/127 X |

FOREIGN PATENT DOCUMENTS

| 1,191,693 | 10/1959 | France | 336/216 |
|---|---|---|---|
| 11,729 | 9/1956 | Germany | 336/176 |
| 2,331,488 | 1/1974 | Germany | 336/176 |
| 344,575 | 3/1931 | United Kingdom | 336/176 |

Primary Examiner—Thomas J. Kozma
Attorney, Agent, or Firm—Emrich, Root, O'Keeffe & Lee

[57] ABSTRACT

A split core current transformer for coupling monitoring apparatus to a current carrying conductor includes a two-piece annular core structure formed by first and second arcuate core assemblies having windings, connectable to the monitoring apparatus, wound on laminated core sections, the laminated core sections each including a plurality of flat lamination elements arranged in a stacked configuration with alternate elements having generally circular end portions which project beyond the main body portion of the arcuate core section at each end thereof defining generally circular gaps, permitting interleaving of the projecting end portions of the core sections of the two core assemblies providing an annular core structure having two interleaved joints which are held together by way of removable hinge pins which permit separation of the interleaved projecting end portions at either one of the joints to facilitate coupling to the current carrying conductor.

1 Claim, 8 Drawing Figures

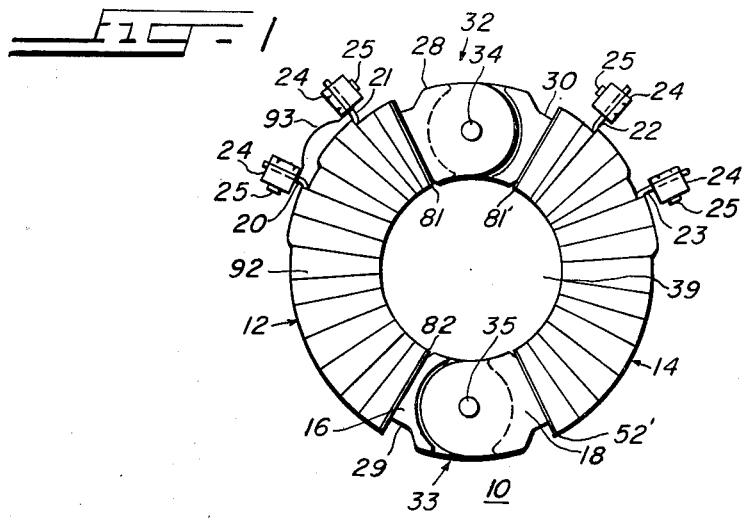
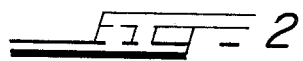
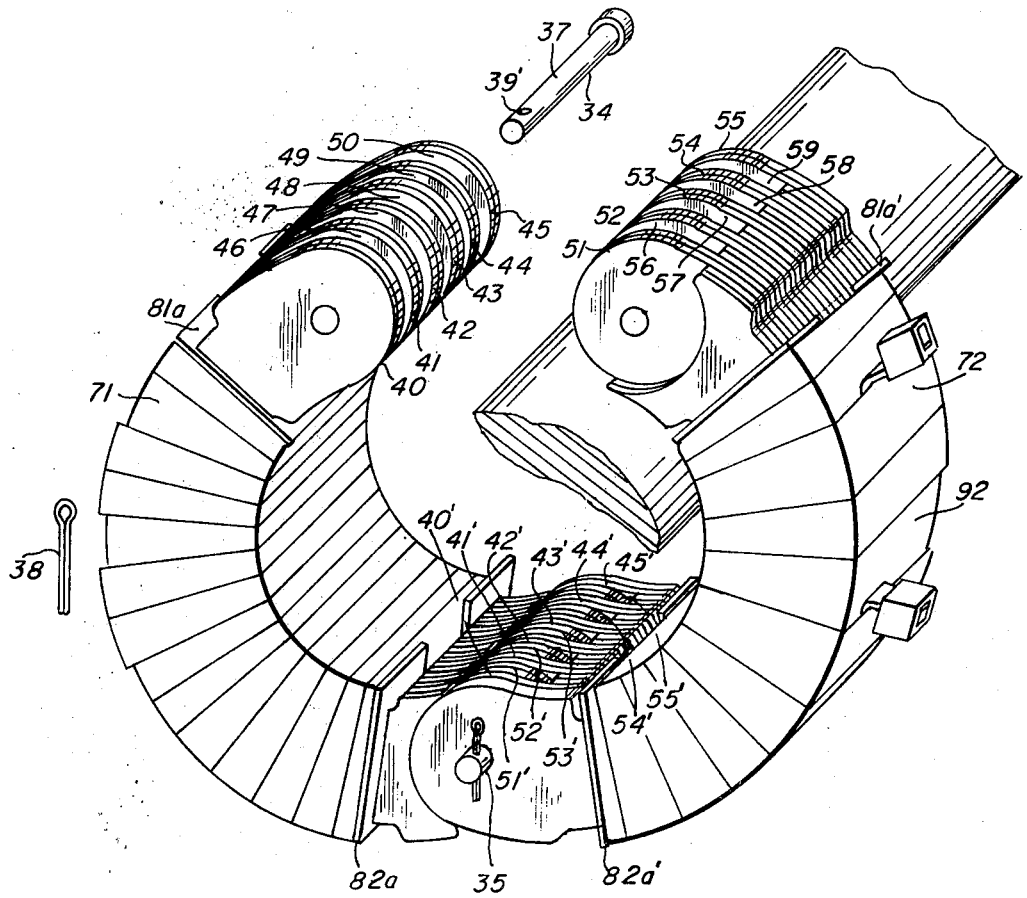

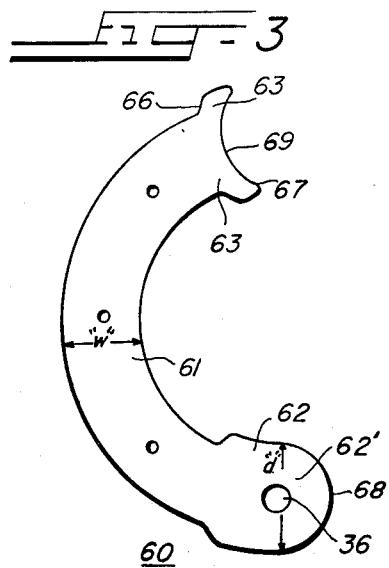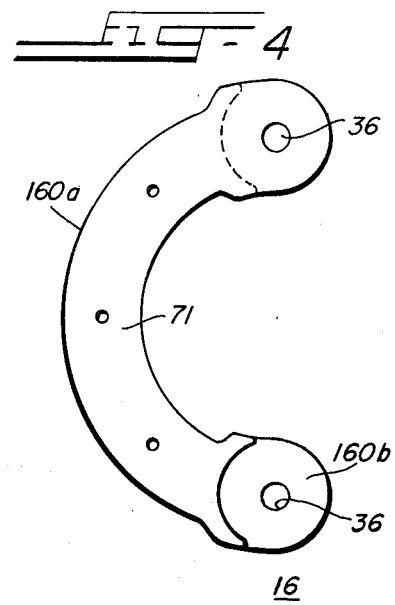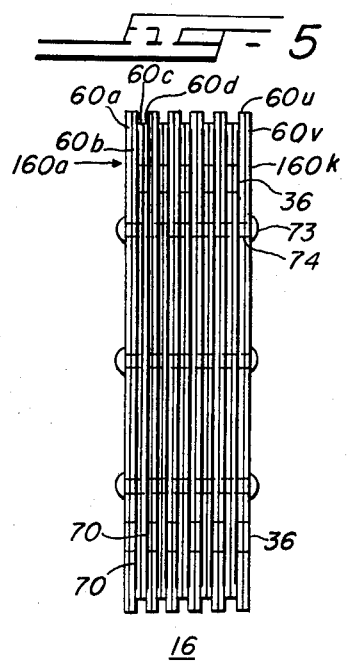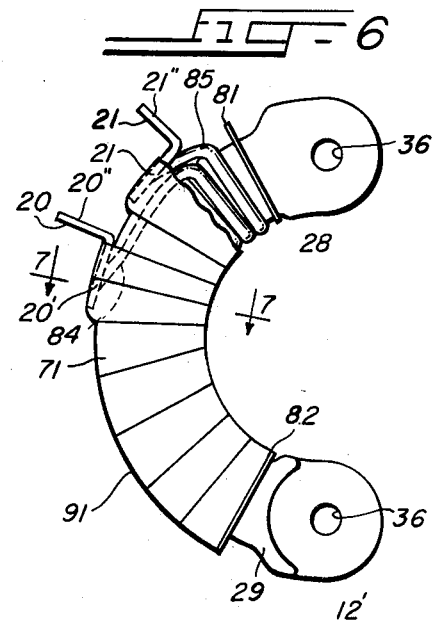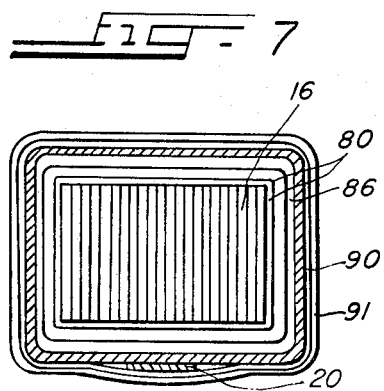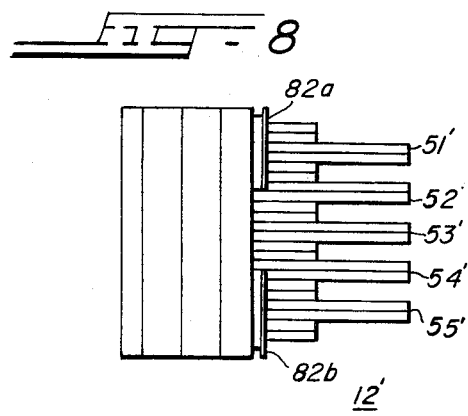

SPLIT CORE CURRENT TRANSFORMER HAVING AN INTERLEAVED JOINT AND HINGE STRUCTURE

BACKGROUND OF THE INVENTION

1. Field of the Invention

This invention relates to current transformers, and more particularly to a split core current transformer for use in measuring current flow through current carrying conductors.

2. Description of the Prior Art

In the electrical power industry there is a need to monitor current flow over power conductors for the purpose of load survey and load management, for example. For such purposes, current transformers are used to couple the power conductor to a suitable measuring apparatus, such as a load survey recorder. The installation of a standard instrument transformer usually necessitates interrupting the power circuit and cutting into cabling or busses, requirements which are both undesirable and expensive.

Moreover, in most cases, the measuring apparatus and associated current transformers are installed on a temporary basis while the desired data is recorded and thereafter, the instrumentation is removed. The instrumentation must be re-installed whenever repeat measurements are required.

One known current transformer has been developed which has a split core which permits the transformer to be clamped onto the current carrying conductor to eliminate the undesirable requirements of circuit interruption or cutting into cabling or busses. The transformer has two rectangular core members with a fixed bridge member interconnecting the two core members at first ends and a movable bridge member interconnecting the core members at the other ends, forming a rectangular core structure for the transformer. The movable bridge member is hinged at one end and may be pivoted to open the core structure permitting the transformer to be placed around the conductor.

However, the rectangular core structure of the transformer, which is comprised of two rectangular core members and two bridge members has four separate air gaps in the magnetic path for the transformer. In addition, the core sections are of different configurations, resulting in increased production costs for the transformer. Also, the provision of the hinged bridge member results in a reduced amount of magnetic material in the proximity of the hinge, and as a result adversely influences phase angle accuracy.

Another known split core current transformer employs a pair of generally arcuate core members hinged together at one end with the magnetic path being completed by a butt joint at the other end. While such transformer is of simpler construction than the rectangular split core transformer described above and provides a circular magnetic path which is shorter than that of a rectangular split core transformer of comparable size, the butt joint results in a significant air gap at the junction between core sections such that the transformer is generally unsuitable for applications where repeatability of measurement is required.

SUMMARY OF THE INVENTION

The present inventon has provided a split core current transformer including first and second core assemblies each having laminated core sections with windings wound thereon and hinged joints which permit opening of the transformer to facilitate coupling to a current carrying conductor. In accordance with the present invention, each core section includes a plurality of identical lamination members of a magnetic permeable material. The configuration of the lamination members and the manner in which the lamination members are arranged in the core sections results in an increased amount of magnetic permeable material in the proximity of the junctions between the core sections.

In accordance with a disclosed embodiment, the lamination members are of a generally arcuate shape providing two generally arcuate core sections which, when assembled, provide an annular core structure for the transformer. In addition, the two core sections are connected together at both ends by way of interleaved joint and hinge structures which thus maximize the amount of magnetic permeable material in the proximity of the joints, thereby minimizing the effect of the air gap on the performance of the transformer. The interleaved joint and hinge structure also permits the transformer to be opened at either end for coupling the transformer to a current carrying conductor.

In the disclosed embodiment, the plurality of lamination members which comprises each core section are arranged in a stacked configuration with alternate members having generally circular end portions which project beyond the main body portion of the arcuate core section at each end thereof defining generally circular gaps, permitting interleaving of the projecting end portions mating ends of the two core sections to provide two interleaved joints. The projecting portions of the mating ends are held together by removable hinge pins which permit separation of the interleaved projecting end portions at either one of the joints.

The use of identical lamination members for both core sections minimizes manufacturing costs for the transformer. The provision of a circular magnetic path, having only two air gaps and the increased amount of magnetic permeable material provided in the proximity of the air gap improves the phase angle accuracy of the transformer as well as repeatability of measurement. Accordingly, the transformer is practical for use in measurement of watts, volt-amps and VAR for survey and control applications.

Thus, the transformer not only can be used for current measurements, but may also be used for both real and reactive power or energy measurements for survey purposes, and the secondary winding of the transformer adapts the transformer to a wide range of instrumentation and load management equipment. The transformer is of relatively small size which enables it to be used in cable runs, switches, and other similar installations where space is at a premium.

DESCRIPTION OF THE DRAWINGS

FIG. 1 is a side view of split core transformer provided by the present invention;

FIG. 2 is a perspective view of the split core transformer shown in an open position;

FIG. 3 is a plan view of a lamination element of a core structure of the transformer shown in FIG. 1;

FIG. 4 is a plan view of a core structure employed in the transformer of FIG. 1;

FIG. 5 is an end view of the transformer core structure shown in FIG. 4;

FIG. 6 is a plan view of a transformer winding assembly of the transformer shown in FIG. 1;

FIG. 7 is a sectional view of the winding assembly taken along lines 7—7 of FIG. 6 and rotated 90°; and, FIG. 8 is an end view of the winding assembly shown in FIG. 6.

DESCRIPTION OF A PREFERRED EMBODIMENT

Referring to FIG. 1 there is shown a side view of a split core current transformer 10, provided by the present invention. The transformer 10 may, for example, be used in portable load survey recorders, demand load controllers and similar apparatus for coupling the apparatus to a current carrying conductor to permit monitoring of current flow through the conductor.

The transformer 10, which is shown in the closed position in FIG. 1, includes a pair of generally arcuate core assemblies 12 and 14, each including a laminated core section, such as core section 16 for assembly 12 on which is wound a winding having ends connected to terminals 20 and 21. The core assembly 14, which is similar to core assembly 12, includes a laminated core section 18, which is identical to core section 16, and having a winding wound thereon which has ends connected to terminals 22 and 23. Terminals 20-23 have collars 24 secured thereto by way of set screws 25 which facilitate the connection of the transformer 10 to monitoring apparatus, such as a load survey recorder.

One end 28 of core section 16 is connected to a mating end 30 of core section 18 by way of an interleaved joint and hinge structure indicated generally at 32, and the other end 29 of core section 16 is connected to a mating end 31 of core section 18 by way of an interleaved joint and hinge structure, indicated generally at 33, forming an annular shaped core for the transformer 10, having a central window 39 for receiving the current carrying conductor.

Referring to FIG. 2, which is a perspective view of the transformer 10, shown in an open position, end 28 of core section 16 has a plurality of portions 40-45, six in the illustrative embodiment, which project from the main body portion 71 of the core section 16 and which are spaced apart defining five gaps 46-50 therebetween. The mating end 30 of core section 18 has five portions 51-55 which project from the main body portion 72 of core section 18, defining four gaps 56-59 therebetween. When the transformer 10 is in the closed position as shown in FIG. 1, the projecting portions 51-55 of core section 18 are received in gaps 46-50 of core section 16, and portions 41-44 of core section 16 are received in gaps 56-59 of core section 18, providing the interleaved portion of the joint and hinge structure 32. When the transformer 10 is in the closed position, the mating end portions 28 and 30 are held together by way of a flanged hinge pin 34 having a shank 37 which extends through central apertures 36 (FIG. 2) of the projecting portions 40-45 and 51-55 which apertures are aligned when the transformer 10 is in the closed position. A hitch clip 38 extends through an aperture 39' in the shank 37 to maintain the hinge pin in position.

The configuration of end 29 of core section 16 is identical to that of end 30 of core section 18, and the configuration of end 31 of core section 18 is identical to that of end 28 of core section 16, each having respective projecting portions 51'-55' and 40'-45' which provide an interleaved joint. The mating ends 29-31 are held together by way of a hinge pin 35.

The interleaved hinged construction of the transformer 10 permits the split core transformer 10 to be opened by removing hinge pin 34, which hinge pin 35 in place, and separating ends 28 and 30 of respective core assemblies 12 and 14, which are pivoted about hinge pin 35, as shown in FIG. 2, or by removing hinge pin 35, with hinge pin 34 in place and separating ends 29 and 31 of the assemblies which are pivoted about hinge 34. Thus, the interleaved joint and hinge construction permit the split core to be opened at either end to facilitate positioning of the current carrying conductor within the window 39 of the transformer 10. The interleaving of the projecting portions of the core assemblies 12 and 14 minimizes the effects of the air gap on the performance of the split core transformer 10 and enhances repeatability of measurement. Also, the annular shape of the two piece core structure provided by core sections 16 and 18 provides a generally circular magnetic path having only two air gaps, one at each of the interleaved joints 32 and 33.

Considering the core sections 16 and 18 in more detail, each core section, such as core section 16, includes a plurality of lamination element, such as lamination element 60 shown in FIG. 3. The plurality of lamination elements 60 which comprise both core sections 16 and 18 are identical in shape. Each element, such as element 60, is of a magnetic permeable material which may be of conventional silicon steel, and has a generally arcuate main body portion 61 having a head portion 62 at one end and a tail portion 63 at the opposite end.

The head portion 62 has an increased width relative to the main body portion 61 which defines a generally circular contact area 62' which extends beyond the main body portion 61 of the element 60 and provides a rounded end 68 for the element 60. The diameter $d$ of the contact area 62' is greater than the width $w$ of main body portion 61, and in one embodiment, the diameter $d$ was 1.3 inches and the width $w$ was $\frac{7}{8}$ inches. The contact area of the head portion 62 has a central aperture 36 through which extends the hinge pin 34 in the assembled transformer 10.

As shown in FIG. 2, the head portions 62 of the elements 60 of core section 16 project from the main body portion 71 of the core section 16 at ends 28 and 29 thereof defining portions 40-45 and 51'-55'. The head portions 62 of the elements 60 of core section 18 define projections 51-55 and 40'-45' at ends 30 and 31, respectively.

The tail portion 63 of each lamination element 60 is a generally arcuate strip 63' extending perpendicular to the axial centerline of the main body portion 62 defining ear portions 66 and 67 which extend outwardly beyond the main body portion 62. The arcuate strip portion 63' defines a concave end surface 69 for the lamination element 60, the radius of which is approximately the same as the radius of the rounded end 68 of the head portion 62.

Referring to FIGS. 4 and 5, the plurality of lamination elements 60 which form each of the core sections 16 and 18, such as core section 16, are arranged in pairs of elements, defining lamination members 160a-160k which are stacked together to form the core section 16 as shown in FIG. 5. The lamination elements 60 are used in pairs to provide increased mechanical strength. In the exemplary embodiment, each core section includes twenty-two lamination elements 60a-60v grouped into eleven pairs 160a-160k of elements.

As shown in FIG. 4, the pairs of lamination elements 60 are alternated in the core section 16 in reversed orientation. That is, pair 160a, including elements 60a and 60b, have head portions, which define projecting portion 40 (FIG. 2) at end 28 of the core section 16, and tail portions which define gap 46 (FIG. 2) at the other end 29 of the core section 16. The next adjaent pair 160b, including elements 60c and 60d, have head portions, which define gap 46 (FIG. 2), at end 29 of the core section 16. The adjacent pairs of elements in the core section 16, such as pairs 160a and 160b, are separated by a spacer member 70 of magnetic material and are maintained together in the core section 16 by way of rivets 73 which pass through apertures 74 formed in the lamination elements 60 as shown in FIG. 5. The other core section 18 is identical to core section 16.

Referring to FIG. 2, when the two core sections 16 and 18 are assembled, the concave end surface 69 of the tail portion 63 of the lamination members 160 which comprise each core section define radial bearing surfaces which are engaged by the rounded end surface 68 of head portions 63, which project from the mating end of the other core section. The radial bearing surfaces enable pivotal movement of the core sections 16 and 18. In addition, in the exemplary embodiment, which has 10 interleaving surfaces at each joint, the circular contact areas 62' of the 10 head portions 62 define an effective area of approximately 13.28 square inches maximizing air gap area magnetic material at the hinge point. A cross-sectional area of the magnetic permeable material in the proximity of the air gaps defined by a plane perpendicular to the axial centerline of aperture 36 of the interleaved projecting portions is greater than the crosssection area of the main body portions. The additional magnetic permeable material in the proximity of the air gaps minimizes reluctance thereat such that the larger amount of steel in the area of the air gaps improves the phase angle accuracy of the transformer 10 and makes it practical to use in measurement of watts, volt-amps and VAR for survey and control applications.

Referring to FIG. 6, which is a plan view of a core and transformer winding assembly 12' for core assembly 12, the winding 80 for core assembly 12 is wound on core section 16 in two layers, between two end members 81 and 82, which are disposed adjacent the ends 28 and 29, respectively. The end members 81 and 82, which are best shown in FIG. 2, as comprising a pair of generally C-shaped elements, such as elements 81a and 81b for end member 81, locate the winding 80 within the main body portion 71 of the core structure 16. The decreased width w of the main body porton 71 (FIG. 4) of the core structure 16 affords space for the winding 80 thereby minimizing the size of the transformer 10. In one embodiment, the outer diameter of the transformer 10 was approximately 5.5 inches, the thickness of the transformer 10 was approximately 2 inches, and the diameter of the window 39 was approximately 2½ inches.

In the exemplary embodiment, the winding 80 comprised 38 turns of 15 gauge H Nylese wire, and the ends 84 and 85 of winding 80 terminate adjacent end member 81 and are soldered to tang portions 20' and 21' of terminals 20 and 21 as shown in FIG. 8. The terminals 20 and 21 have terminal portions 20" and 21" which extend at right angles to tang portions 20' and 21' and to the core structure 16.

As shown in the sectional view of FIG. 7, suitable insulators 86 are provided to insulate the winding 80 from the terminals 20 and 21. The ends 84 and 85 of the windings 80 pass through apertures 88 in the insulators 86 and are connected to terminals 20 and 21. The start 84 of the winding 80 is connected to terminal 20 and the end 85 of the winding 80 is connected to terminal 21.

The terminals 20 and 21 and the insulators 86 and 87 are secured to the core section 16 by way of glass fiber tape 90, which in turn is covered by one layer of cotton tape 91.

Referring to FIG. 1, the core transformer winding assembly 12' of FIG. 6 is wrapped with one layer of acetate tape 92 and the collars 24 are added to the terminal portions 20" and 21" to provide the assembled core assembly 12.

The structure of core assembly 14 is the same as that of core assembly 12 except that the winding on core 18 comprisd 39 turns of 15 gauge H Nylese wire with the start of the winding being connected to terminal 23 and the end of the winding being connected to terminal 22.

The transformer 10 is a dual range transformer and has a 5 amp secondary rating. With the number of turns for the windings as noted above, the transformer is rated for a five amp output for a maximum conductor current of 200 amps when the windings are connected in parallel, that is with terminals 20 and 21 connected to terminals 22 and 23, respectively, and the output taken from terminals 20 and 23. When the windings are connected in series, with terminals 21 and 22 connected together, and the output taken from terminals 20 and 23, the transformer 10 is rated for a five amp output for a maximum conductor current of 400 amps.

Higher current ratings, up to 1000 amps, can be obtained by using a larger number turns for the two windings of the transformer. Also, winding 80 may be short circuited through the use of a shorting link 93, which is connected between terminals 20 and 21, to prevent high voltage being generated when there is no load to the winding. The shorting link 93 also reduces the magnetizing force which acts to keep the core closed when removing the transformer 10 from a cable which is carrying current.

The transformer 10 has a thermal rating factor of 2 and the short time thermal overload rating is 350% of normal current for fifteen minutes. On the parallel connection, the transformer has sufficient accuracy for use in non-billing applications when used with 0.2 ohm burdens and when used with the series connections, the transformer 10 has comparable accuracy in non-billing applications when used with 0.5 ohm burden instrumentation.

The stable magnetic structure provides repeatable results when the transformer 10 is installed or reinstalled. The transformer 10 not only can be used for current measurements, but may also be used for both real and reactive power or energy measurements for survey purposes. The 5 ampere secondary which has a thermal rating factor of 2 adapts it to a wide range of instrumentation and load management equipment.

I claim:

1. In a split core current transformer having first and second arcuate core sections made of lamination members engageable at their respective ends to provide a core structure having a generally circular magnetic path with air gaps located only at the two respective ends of the core sections, the lamination members of the first and second core sections being identical in shape, each of said laminations having a main body portion with a head portion at one end thereof which terminates in a rounded convex end surface and a tail portion at the opposite end thereof which terminates in a rounded concave end surface, the width of the portion of each core section at said first and second ends thereof being greater than the width of the main body intermediate said first and second ends, a first winding wound on the main body portion of said first core section and a second winding wound on the main body portion of said second core section, said first core section and said second core section each having a first group and a second group of said laminations, the ends of the laminations in adjacent groups projecting alternately from one another to provide staggered projections which extend outwardly at each end of the core to interleave with corresponding projections on the other core section, the width of the projecting portions of the lamination groups which interleave being greater than the width of the main body portion to provide an increased area of magnetic permeable material in the region of the two core air gaps, and hinge means extending through the interleaved projections of increased width at one end of said core section to permit relative pivotal movement of said first and second core sections about said hinge means to bring the projections of increased width at the other end of the first and second cores into interleaved relation.

* * * * *